United States Patent
Grundmann et al.

(10) Patent No.: US 6,327,686 B1
(45) Date of Patent: Dec. 4, 2001

(54) METHOD FOR ANALYZING MANUFACTURING TEST PATTERN COVERAGE OF CRITICAL DELAY CIRCUIT PATHS

(75) Inventors: William John Grundmann, Westborough; Nicholas Lee Rethman, North Andover, both of MA (US)

(73) Assignee: Compaq Computer Corporation, Houston, TX (US)

( * ) Notice: Subject to any disclaimer, the term of this patent is extended or adjusted under 35 U.S.C. 154(b) by 0 days.

(21) Appl. No.: 09/298,265

(22) Filed: Apr. 22, 1999

(51) Int. Cl.[7] .................................................. G06F 11/00
(52) U.S. Cl. ................................ 714/738; 714/724
(58) Field of Search .................... 714/738, 735, 714/736, 724

(56) References Cited

U.S. PATENT DOCUMENTS 5,177,440 * 1/1993 Walker, III et al. ............. 324/158 R
6,105,153 * 8/2000 Yamada ................................. 714/724
6,148,425 * 11/2000 Bhawmik et al. .................... 714/726

* cited by examiner

*Primary Examiner*—Phung M. Chung
(74) *Attorney, Agent, or Firm*—Hamilton, Brook, Smith & Reynolds, P.C.

(57) ABSTRACT

An efficient method is presented for automatically verifying test patterns devised to detect speed critical faults in electrical circuits, with minimal human intervention. The method provides a controlled momentary inversion of a logic value at a control point within the circuit being tested or simulated, and then checks the measured or simulated circuit's output value. If the momentary logic inversion causes an inverted logic output, then the test pattern under evaluation has been determined to be capable of detecting circuits that have failures due to speed critical problems. With such an arrangement it is possible to determine whether specific test patterns will accurately measure the performance of circuit paths that have potential operating speed related problems.

17 Claims, 6 Drawing Sheets

METHOD FOR ANALYZING MANUFACTURING TEST PATTERN COVERAGE OF CRITICAL DELAY CIRCUIT PATHS

BACKGROUND OF THE INVENTION

During the manufacturing of integrated circuits, generally referred to as ICs, some method is required to test each individual electrical circuit on the IC to determine whether it meets the product requirements of functionality, signal timing, signal speed, power consumption, and thermal limits. Such IC testing is performed several times during the course of IC manufacture. Semiconductor substrates, generally known as wafers and generally made of silicon, are tested partway through the manufacturing process to determine whether it is economical to complete manufacture, or dispose of or recycle the silicon wafer. Finished silicon wafers are tested to determine which individual ICs are functional and thus should be packaged, versus which ICs are defective and should be discarded. Packaged ICs are tested to determine if damage has occurred during packaging operations, and whether the finished component is fast enough to meet specifications. Packaged ICs are also subjected to accelerated lifetime testing to determine the probable average lifetime of the IC, often referred to as the mean time to failure. Packaged ICs may be subjected to what is known as burn in, to determine which ICs have infancy failure problems. In all of the above noted situations, the IC must be connected to some sort of test system and functionally operated to determine if the IC is operational and within specifications.

It is known in the art to use computerized test systems to measure performance of IC circuits by means of what are known as test patterns. Test patterns consist of lines of computer code which direct the computerized test system to provide specified voltage and current levels to specified electrical input and power connections on the IC for specified periods of time. The test patterns also contain test system information as to the correct output voltage, current, and the timing to expect on specified output connections of the IC. In other words, test patterns consist of input stimuli and expected output results. The test patterns are developed and exercised on the ICs in an attempt to uncover manufacturing defects and reliability problems, as well as operating speed problems, design margin deficiencies, and operating window width problems. All of this testing is necessary to prevent electronic parts that do not meet specifications for speed, power consumption, and operational margins from being delivered to customers.

One of the goals of IC test patterns is to make sure that each circuit meets its clocking frequency requirements. This means looking for operational circuits that may have functionality problems at certain clocking frequencies due to specific signal paths within the IC design having speed critical timing problems. Thus, test patterns are designed to look for marginal design deficiencies that prevent proper circuit operation depending on the clock frequency used. Speed critical circuit paths are those parts of the IC design that have difficulty meeting all of the timing requirements at some specified clock frequency.

Most IC circuits have timing critical issues to one degree or another in some parts of their design. The faster the desired IC operational clock speed, the more likely it is, in general, for there to be serious timing requirements somewhere in the circuit. The maximum frequency or speed at which clocking of an IC can occur is determined by the implementation of the IC design's logic and circuit timing. For example, if the time it takes an electrical signal to propagate through a particular group of logic elements from one latch to another is close to the clock frequency, then variations in manufacturing or in circuit operating temperatures may cause slightly slower propagation and result in a failure of the IC due to the logic signal not arriving at the latch before the clock signal. Even if the signal propagation on a device is fast enough to beat the average specified clock signal, it may still result in a failure at a clock frequency that is higher than average but still within the specified range. Since higher frequency operation results in greater IC functional capability, there is always a desire within the industry to operate ICs at ever faster clock rates, thus increasing the sensitivity of the IC to the above noted speed critical timing problems.

In order to determine which parts of a circuit design have timing critical issues, it is possible to perform what is known as a design verification or a timing verification. A timing verification is a computer simulation of either the static or dynamic operation of the circuit design. This computer simulation is also known as a circuit model. The simulation predicts which parts of a particular design are likely to have timing critical issues. These critical circuit paths should be tested over the full specification range of values on each individual IC, in order to ensure that only ICs that meet the specification reach the customer. Typically, test patterns are generated to especially test the predicted speed critical paths, either manually or by automatic methods depending upon the type of electronic circuit. The test patterns may be used either during a simulation of the circuit function, or during testing of manufactured devices to determine circuit function under various conditions.

However, proving that the test patterns generated to test the function of suspect circuit paths actually work to uncover speed issues in the circuit design has been historically difficult. This is because it depends on the large number of possible different states that the IC may access and upon the many different input signal values. A change in state at the point of interest must still be observable to the outside world through a propagation path. In other words, how do you verify the operation of the test patterns that were generated, and what is your test coverage?

There are two methods known in the art to verify the timing of an IC design. The first known method to verify speed critical circuit paths is empirical electrical tests on the IC design after it has been manufactured in silicon, or other semiconductor material. The test patterns are typically used by a computer to functionally operate the IC at various high clock speeds to determine what clock rate induces failure. This method is not used very often because of the long lead times necessary to fabricate a specific circuit design in silicon, and because of the expense of fabricating ICs that may be a total or partial loss due to speed sensitive design faults.

The second method is either a static or a dynamic timing simulation of the circuit, with the circuit designer working with the simulation program to correct the IC design based on the simulation results. A static verifier, such as Zeist by Compaq, Pathmill by Synopsis, or Pearl by Cadence, is a patternless analysis of the circuit design looking for possible problems. A dynamic simulation program, such as SPICE by the University of California at Berkeley, is a pattern-based simulation of the circuit design which can be used to look for problems that are stimulated and observed by the test patterns. Static timing verification is becoming more popular since dynamic simulation is computationally expensive and prone to miss potential problems. This is known as inadequate pattern coverage. Dynamic timing verification methods are popular even though there is no method to ensure that all of the speed critical paths known to the IC designer will have a test pattern generated that can successfully test for a potential IC speed problem.

Timing simulation methods require that the circuit under test must have two features in order to demonstrate the validity of the test pattern, or test coverage. The first necessary feature is that the circuit design have adequate controllability. This means the circuit can be prompted to change state or to be stimulated to a changed state with the application of a new set of input signals.

The second necessary circuit feature to properly validate a test pattern is observability, or the ability to observe a change in electronic state within the circuit. Another term for these two features is COPs (Controllability Observability Points). COPs may be designed into a circuit at the circuit logic level, and the number of possible COPs will vary depending on the circuit design methodology, i.e., full custom, standard cell, gate array, or programable array.

There are two main methods known in the art to provide the test patterns for the proper testing of speed critical paths. The first method is known as ATPG or automatic test pattern generation. While the static simulation methods used to generate the ATPG test patterns are generally thought to be sufficient to ensure that speed critical issues are properly tested, it would be a benefit to have a method to verify or prove that the generated test pattern does accurately screen speed critical paths. ATPG also requires additional circuitry be placed on the silicon, which results in larger die sizes, more expense, and reduced circuit operating speeds. Further, industry experience shows that since the number of possible logical inputs to a speed critical path plus the inputs to the propagation path that leads to an observability point are too numerous to have confidence that all possible timing combinations are taken into account in the ATPG test pattern. In some cases, more than half of the speed critical paths have been found to not be properly covered by the test patterns. For example, a test pattern that does test for speed problems in a critical circuit may simply not have every input to the propagation circuit enabled, and thus not see the speed sensitive problem.

The second method known in the art to provide test patterns is known as ad-hoc manual generation. This method requires the intensive manual efforts of the circuit designer and test engineer to attempt to write test patterns to properly test the known and suspected speed critical paths. In the worst case, the COPs are the input and output electrical connections of the IC itself. This method is more expensive than ATPG and suffers from what is known as a test coverage problem, in that there is no method to ensure that all of the suspected or known speed critical circuits are properly tested by the manually generated patterns.

The timing and speed issues are not the only problems in test pattern verification. Similar situations exist whenever an internal node of a circuit is not directly detectable to the designer or user. Any type of problem that can occur inside the logic of an electronic system may not be detectable by the designer because of the additional circuit elements needed to propagate the logic to a point where the signal is detectable. Thus, there exists a problem in the art of efficiently evaluating test patterns to ensure that they do indeed accurately test the speed critical paths for the IC or other electronic device.

SUMMARY OF THE INVENTION

The present invention solves the problem of verifying whether a test pattern uniquely covers an individual speed critical circuit path on an IC. The method is easily applied to cover all known or suspected speed critical circuits within a specific circuit design by iterative application to each individual suspected speed critical circuit.

A speed critical circuit path may be characterized as the summation of one or more combinatorial and sequential gate delays, the total delay potentially taking longer than the time allowed by the clocking scheme of the circuit design. A critical circuit path starts with one clock edge or with a design input connection's timing requirement. The characteristics of a speed critical circuit path taking too long to properly function at a specific clock rate, or with specific timing constraints, are indicated by the termination point of the circuit path having either the incorrect logic state at the end of the time period, or having an incorrect logic transition. The present invention verifies the test pattern without requiring that all of the individual circuit delays, and combinations of speed variations, be calculated.

The invention uses any of the well-known logic simulation models, circuit logic simulators, and hardware emulators to evaluate trial test patterns. The trial test patterns are developed using any of the standard methods such that they result in a correct logical output value when used upon a manufactured fault free IC that is being operated within the specified clock frequency range. The invention determines whether a particular test pattern does indeed cover the speed critical path by inserting a single momentary logical defect into the logic simulator at a specified point in the circuit. The logical defect is an inversion of the output that occurs only on the condition that all of the inputs and requirements for the critical circuit exist and are correct. The duration of the conditional inversion may be varied. If used for testing actual ICs, the automatic test system's test vectors activate the additional test gates built into the IC. This momentary defect is inserted into a point of the critical circuit being exercised by a test pattern that has been shown to work properly in an IC that has no manufacturing defects. The test pattern may be chosen to control a signal that traverses the known or suspected speed critical circuit path, and the momentary logical fault will be chosen to temporarily invert the logical state. If the subsequent execution of the chosen test pattern results in an inverted value at the circuit path output, then the test pattern does properly cover the introduced momentary timing defect. This result indicates that the test pattern can detect speed sensitive circuit paths and an effective test has been found. If the subsequent execution of the chosen test pattern does not result in an inverted value as compared to the test pattern without the momentary inversion at the speed critical path's output, then the test pattern does not properly test the speed critical path, and a new test pattern must be generated, either manually or by ATPG methods.

The momentary defect introduced by the present invention is different from the well-known electrical tests known as "stuck-at-one" or "stuck-at-zero" defects. The inverted logic value is a conditional inversion of the output value, and causes only a temporary inversion of the proper logical value for a specified time and when all of the input conditions of the critical path are met.

With such an arrangement, test patterns that have been shown to properly test an IC may be further evaluated as to whether they can properly test the IC for clock speed sensitivity, or other internal node failure modes. Such verification is especially important for checking test pattern coverage of critical paths that are either known to the designer or simulator, or are suspected of being speed critical.

The invention provides a momentary inverted logical value for testing a circuit by modifying the circuit to complement a critical path output when, and only when, certain identifying conditions of the critical path occur. By applying test patterns to the modified circuit and determining whether the critical path output indicates a logical value inversion, it is possible to verify that the test pattern can detect speed problems without having to perform dynamic timing simulations.

The method for evaluating test patterns for critical circuit paths consists of determining a logical model for a first circuit path to be verified, including a logical value transition at the output. Using a conditional inverter to insert an inverted logical value at a selected time at a selected location on the circuit path, and determining whether the inverted logical value results in an incorrect logical value at the output of the circuit path. If the incorrect logical value is detected, then the test pattern does properly test for speed sensitivity.

The invention may be predominantly intended for use in simulation and emulations of IC test patterns, but may also be used on simulations or emulations of whole electronic systems, computers, or printed circuit boards. Any electronic system may use the invention to verify the function of test patterns. The invention may also be used on actual ICs or other electronic systems by the addition of the conditional inversion logic disclosed. Such electronic system testing may be used to verify whether the system design is susceptible to clock speed problems or other internal logic node problems, and whether the functional and reliability testing methods are working.

BRIEF DESCRIPTION OF THE DRAWINGS

The foregoing and other objects, features, and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

Figure 1:
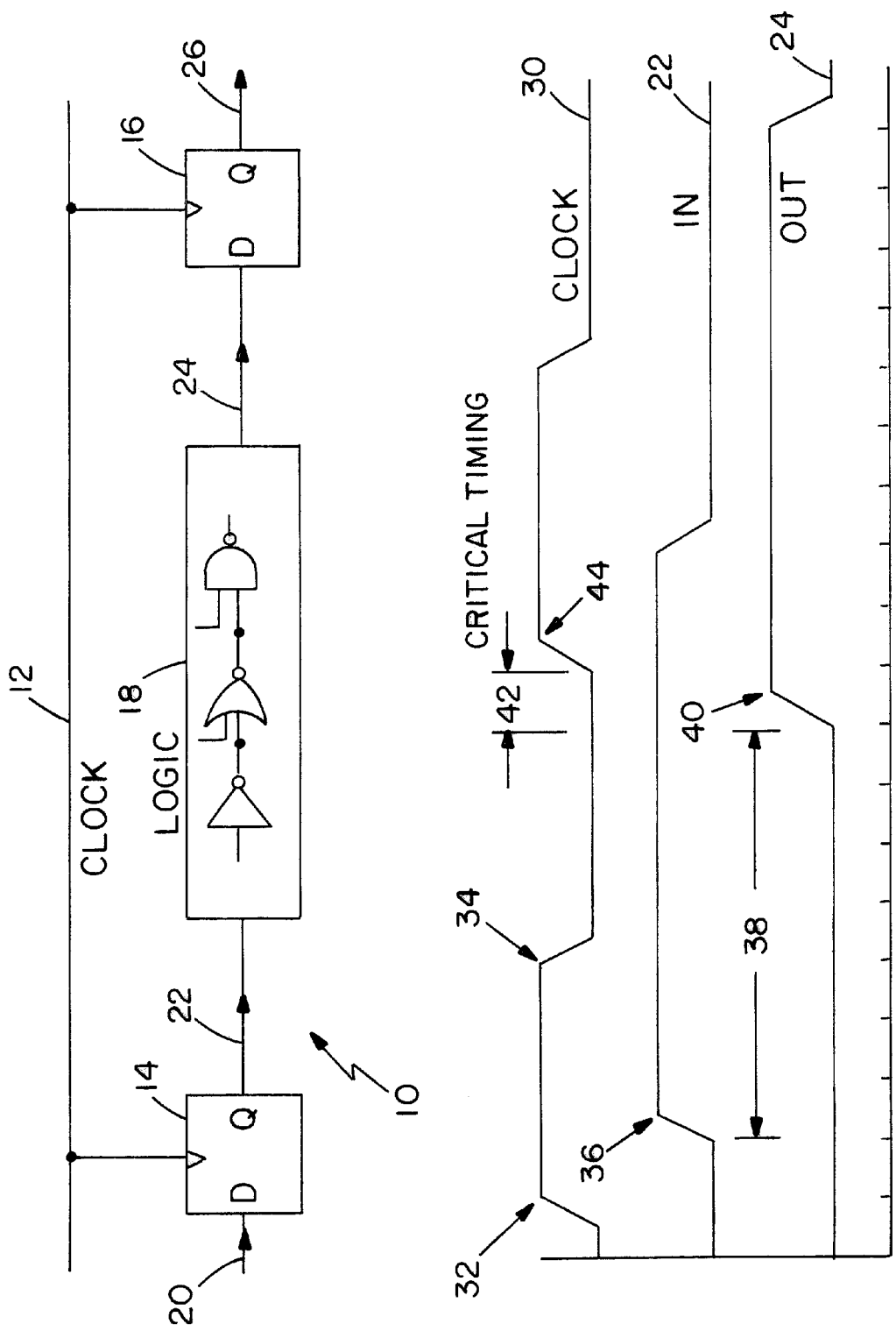
FIG. 1 is a timing diagram of an illustrative circuit.

Referring to FIG. 1, an example circuit 10 has a clock line 12 connected to a clock input of the input latch 14 and a signal out latch 16. The input signal latch 14 connects the IN signal 20 to combinatorial logic 18, which sends the OUT signal 24 to the out latch 16 at some later time, depending on the sequential and serial delays the IN signal encounters in the various logic elements that constitute combinatorial logic element 18. The IN signal 22 is operated upon by combinatorial logic 18 and modified in a way that is predictable by a computer circuit model, and emerges from logic 18 as OUT signal 24 at a predictable time after the IN signal 22 entered logic 18. This is known as the propagation delay. OUT signal 24 goes to latch 16 and is held there until the latch 16 releases signal 26 to connect to another outside logic element, not shown. Note that combinatorial logic element 18 will typically have additional logic input signals, not shown for simplicity.

The clock line 12 provides a regularly varying signal as shown in the timing diagram as clock signal 30. At time 32 the clock signal 30 rises from low to high in this illustrative embodiment of the invention, and remains high until time 34. At some predictable time 36 after the clock signal 30 rises at time 32, the IN signal 22 will switch or transition to the value held by signal 20, and be transmitted to logic 18. After a time delay 38 due to the propagation delay in logic 18, the OUT signal 24 will rise, in this illustrative embodiment, at time 40 and load latch 16. For the signal to behave properly it is important for the OUT signal rise time 40 to occur at least one set up time period 42 before the clock signal 30 rises at time 44.

If the delay 38 is longer than shown in the figure, or if the clock rate was increased leading to clock time 44 occurring earlier, then the latch 16 will switch before the OUT signal 24 has had time to rise, and signal 26 will have an incorrect value due to the failure of the OUT signal 24 to arrive at latch 16 in time. The circuit 10 would then be known as a speed critical circuit because the time needed for the signal to traverse combinatorial logic elements 18 would be greater than the clock speed would allow for correct logic propagation.

Latch 16 may be the output measuring point, or signal 26 may connect to additional non-speed sensitive circuitry leading to a measuring point such as an output pad. Such additional circuitry is known as propagation circuitry because it essentially serves to propagate the value of signal 26 to where it may be observed.

Figure 2:
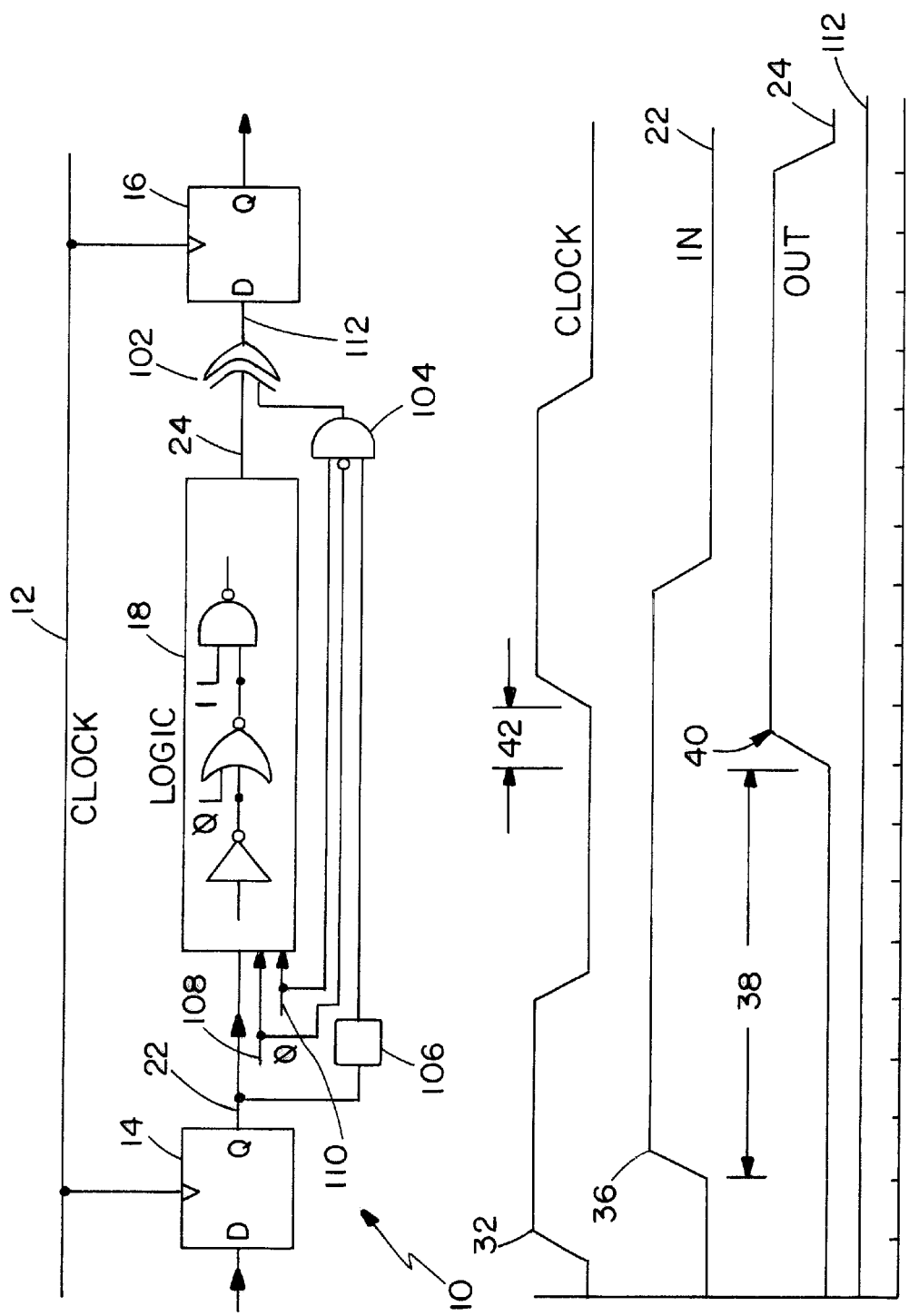
FIG. 2 shows a method to introduce a momentary logic flaw.

In FIG. 2, the circuit of FIG. 1 is shown modified in accordance with a preferred embodiment of the invention by the addition of exclusive OR (XOR) 102 in OUT signal line 24, AND gate 104, edge detector 106, and logic inputs 108 and 110. The IN signal 22 is attached to the combinatorial logic 18 as before, but is also the input to edge detector 106. Logic inputs 108 and 110 represent known inputs to combinatorial logic 18, which in addition to input signal 22 will cause the logic 18 to have a known output value OUT 24, in the present example logical one or high. In the present example, input 108 will be equal to a logical zero, and input 110 will be equal to logical one or high. Edge detector 106 detects, for example, the rising edge 36 of IN signal 22 and holds at the high value for a specified time period, e.g., one clock cycle. Edge detector 106 provides three input AND gates 104 with a logic high. Input 108, which is logical zero or low, is inverted at AND 104 to also give a high. Input 110 is high in this illustrative example, and therefore all three inputs of AND 104 are high; thus, the AND output to XOR 102 is high. Since the OUT signal 24 is also high in this example, the output of the XOR 102 to latch 16 is logical zero or low. Thus, although the OUT signal 24 did rise at the correct time, the output 112 into latch 16 will not rise at time 40 as would have occurred if the additional elements 102 through 110 were not present. Instead of latch 16 receiving the transition of OUT signal 24, the XOR 102 output 112 will have no transition and thus the incorrect logical value, in this example low, as shown in the diagram. Thus, the logical value of latch 16 will be wrong or expressed differently, and the transition 40 will fail to occur at the latch input.

Looking at the above-described method of creating a momentary logic inversion in another way, the XOR 102 acts as a conditional inverter. The condition is that the inputs into logic 18 are correct or, alternatively, that the critical path identifiers (CPI) are found. Thus, the test pattern conditions 22, 108 and 110, which have been used to stimulate logic 18 to produce a logic value signal 24, also activate the AND 104 and the XOR 102 to conditionally invert signal 24. This is true whether signal 24 is a low to high transition, or a high to low transition. The result is the same as if the propagation delay in logic 18 were too slow to arrive at latch 16 before the clock signal 12, and thus eliminates the need to calculate all of the timing interaction of the elements of logic 18. The conditional logic inverter eliminates timing and simulates slow propagation.

If the incorrect signal at latch 16 or the missed transition 40 is detected by the testing program vectors, it has been demonstrated that speed critical behavior of the logic 18 is detectable by the test program, and the test vector set has been verified.

Figure 3:
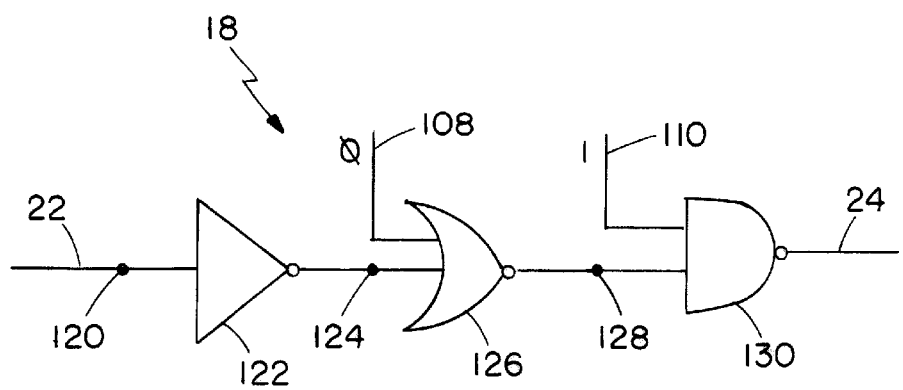
FIG. 3 shows an example of a logic path.
Figure 3:
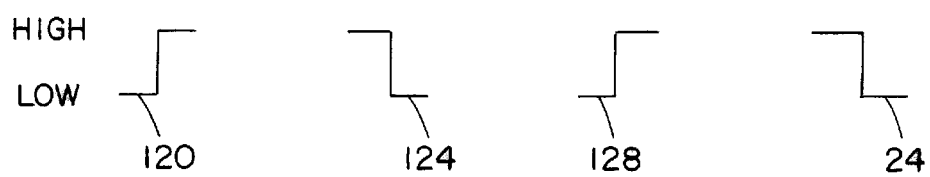

FIG. 3 shows an example of the logic elements in logic 18. In this example, logic 18 has IN signal 22, shown at point 120 as being a low to high transition. Inverter 122 simply inverts the value, and at point 124 a high to low transition occurs at some later time. The NOR gate 126 receives the falling transition, and if input 108 is held to the low logic value, then the NOR output at point 128 will be a rising transition. Similarly, AND gate 130 will show a falling transition at point 24, if input 110 is held high. The various inputs 22, 108 and 110 contribute to determining the value of the output 24 and are called critical path identifiers (CPI). If any of the inputs were different, the path would have a different output. For example, if input 108 were held high, no transition would have occurred.

Figure 4:
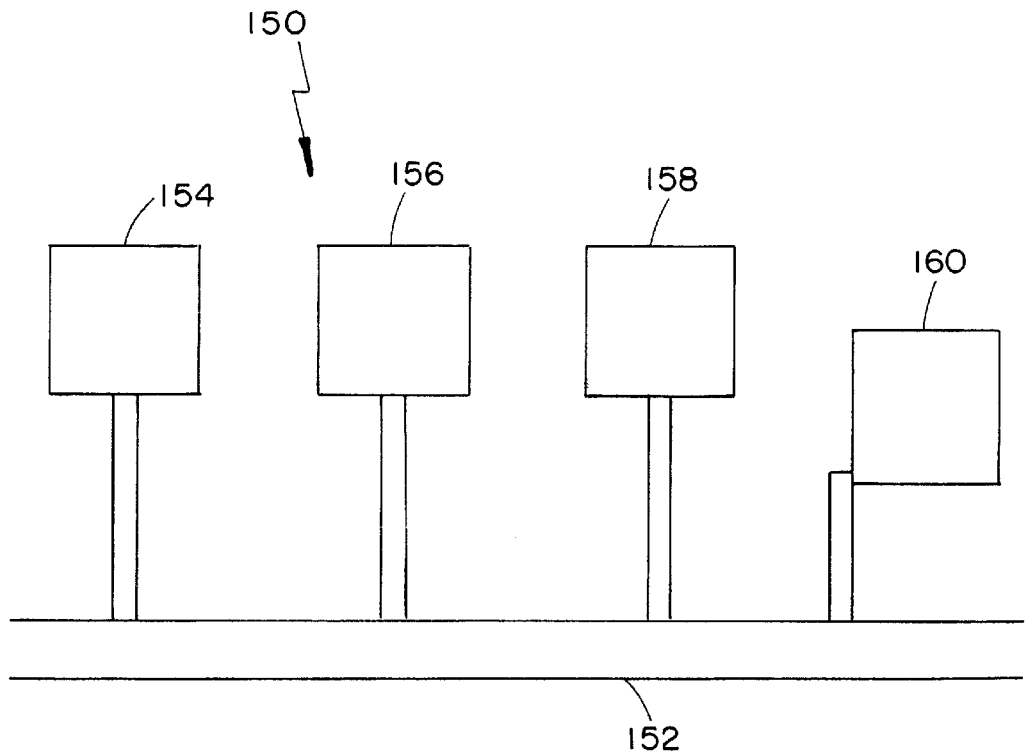
FIG. 4 shows a computer used to functionally test an IC.

The test patterns are typically run on a computer attached to the IC, printed circuit board or computer system that is to be exercised and tested. FIG. 4 shows a tester system 150 having bus 152 connected to a CPU 154 which implements the test patterns. The test patterns are typically stored in a memory unit 156, which is attached to the CPU by means of the bus 152. The test system is directed by the user, via an I/O unit 158, to place the specified voltage and current values onto the specified inputs of the IC or other electronic system to be tested, which is located at probe unit 160. The probe unit 160 may be any of the well-known probe systems in the art, and connects by means of sharp probe tip or other electrical connectors the inputs of the IC or other electronic system to be tested to the desired voltage level. The probe 160 may also check the outputs of the IC or electronic system to evaluate its functional integrity. Before the IC or electronic system can be tested, the test patterns must be verified on a computer model or hardware emulator as discussed below. The computer model may be in a software simulator, or it may be in an PGA circuit emulator. The latter would be positioned in place of the IC in probe unit 160.

Figure 5:
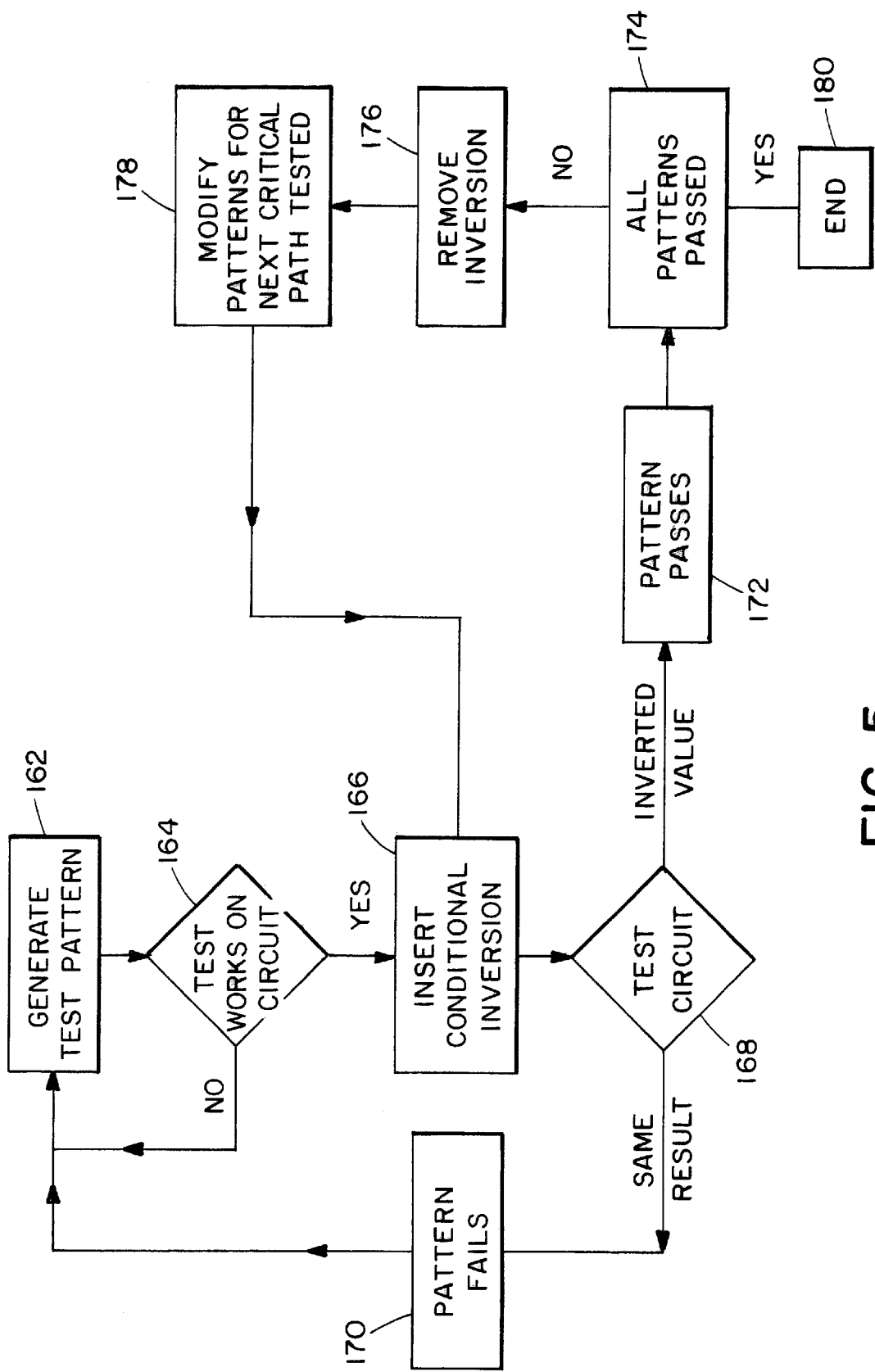
FIG. 5 is a flowchart showing an implementation of the invention.

FIG. 5 is a flowchart showing the use of the invention. A set of test patterns 162 is generated by any well-known method, such as ATPG or manually. Test patterns are exercised on an IC or other electronic system, or in a computer model in step 164. If the test patterns fail to result in the correct output, the test patterns must be rewritten. If the test patterns result in a correct value, then the pattern is accepted as functional. One skilled in the art will recognize the basic flow shown in FIG. 5 as the method used to generate and evaluate proposed test patterns. At this point, the present invention differs from the prior art by inserting a conditional inversion function at step 166, e.g., implemented by the AND gate and XOR gates discussed above with reference to FIGS. 2 and 3. This differs from prior art testing because the "fault" inserted is not a simple "stuck-at-1" or "stuck-at-0", but is an inversion of whatever logic level results from the simulator or actual circuit operation. Additionally, the present invention differs from the prior art in that the logic inversion only occurs when all of the circuit inputs are in the correct state, and only for a specified time period. The time period may be varied, but in this embodiment it is set to one clock period. The modified test pattern again exercises the IC at step 168, and if the test result is the same as previously, then the test pattern fails at step 170 for not detecting the conditional inversion, and the test pattern must be modified or rewritten at step 162 again. If the test pattern result is inverted, the pattern passes at step 172 because the inserted logical inversion was detected. If not all of the speed critical paths that have been identified have passed the test at step 174, the conditional inversion is removed at step 176, and the test patterns are modified if necessary to test the next critical path at step 178. The new conditional inversion for the next critical path is inserted into the test pattern at step 166, and the process continues until all critical path patterns have passed at step 174 and the process ends at step 180.

Figure 6:
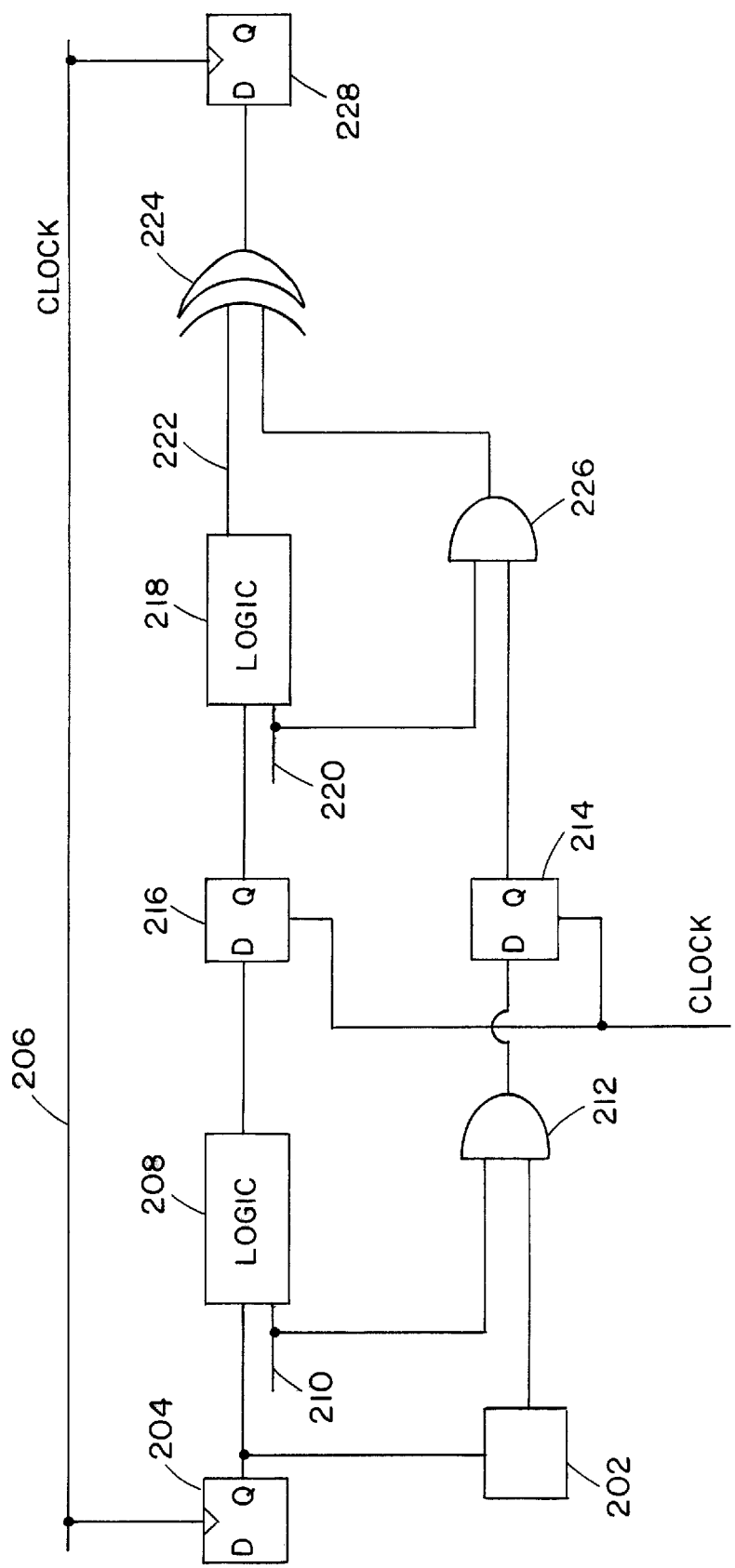
FIG. 6 shows a multiple clock period critical path.

FIG. 6 illustrates an embodiment of the invention that may be useful in evaluating test vectors for critical paths that have intrinsic path delays due to the combinatorial logic that are longer than a single clock cycle. With the occasional speed critical path that takes more than a single clock cycle to propagate through the combinatorial logic, the method previously described may be applied to evaluate the test vectors, but the temporarily inverted fault signal must also be delayed an appropriate time period. Simply viewed, the method of providing the appropriate time delay for the inversion is to duplicate the latch clocking arrangement of the tested combinatorial logic in the added edge detector logic. Thus, FIG. 6 shows that the edge detector 202 receives the output signal of latch 204 during the same clock 206 cycle as the first part of the combinatorial logic 208. Logic 208 also has another input 210, which is set at a known state, a high state in this example, to cause the combinatorial logic to result in a known output value. Both input value 210 and the output of the edge detector 202 are connected to AND gate 212, the output of which feeds level sensitive latch 214. Note that latch 214 is clocked by the same clock as level sensitive latch 216 in the combinatorial logic, and thus serves to automatically time the temporary fault inducing circuitry to the logic being tested. Due to the timing synchronization of latches 214 end 216, the remainder of the combinatorial logic, here represented by logic block 218, and the second input 220, also chosen to result in a known output value of the entire combinatorial logic section, feeds the known logic value on line 222 to one input of XOR 224. Latch 214 connects to AND gate 226, which is connected to the other input of XOR 224, and the temporary inversion of the known signal from the combinatorial logic is complete. If the value of the output as seen at the last latch 228 is the same as value found at latch 228 without the use of the edge detector signal, the test vectors employed are not sensitive to speed critical paths, and a new more sensitive set of test vectors must be produced. If the expected transition at latch 228 is not seen, the evaluation of the test vector set is determined to be sufficiently sensitive to possible speed faults.

Figure 7:
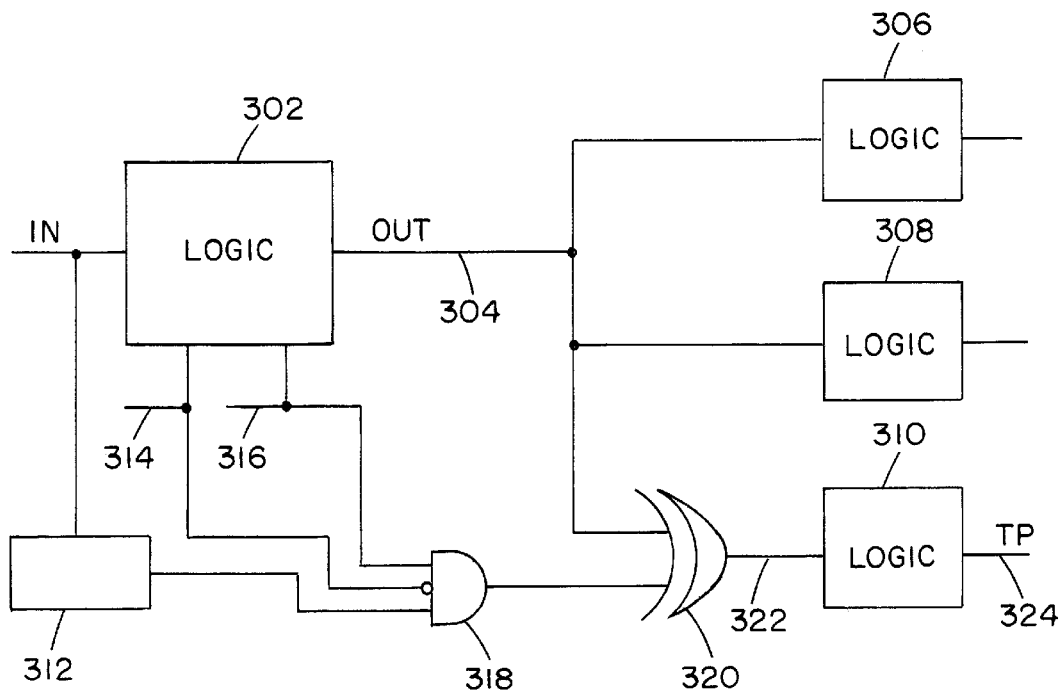
FIG. 7 shows a method to test circuits having logical fanout.

FIG. 7 illustrates an embodiment of the invention that may be useful in evaluating test vectors for critical paths that have multiple fanout connections. Logical paths may exist that have numerous possible output paths, only one of which is suspected of having speed critical problems. Combinatorial logic 302 in this example has an OUT signal 304 that is distributed to three different downstream logic arrays 306, 308 and 310. In the art, this situation would be known as a logic signal having a fanout of three. In this example, it is assumed that only logic array 310 is suspected of having a clock speed sensitivity. The invention as it would be applied to the simulation of this circuit would introduce the edge detector 312, an input 314 to logic 302 that is held low, and an input 316 that is held high, to produce the desired OUT signal 304. The edge detector 312 and inputs 314 and 316 connect to AND gate 318 which, under the conditions specified, outputs a high that is connected to XOR gate. The XOR 320 produces the temporarily inverted signal 322, that causes logic 310 to miss the transition of OUT signal 304. If this missed transition in OUT signal 304 is detected at a test point 324, the test vectors that were used to operate the circuit are proved to be able to test clock speed sensitive circuit paths.

In the case of testing an actual IC, the circuit design would have added the elements 312, 318 and 320 to the ON chip circuit, and the test vectors would include a line that activates the edge detector 312 for a given time period. If for example the test point 324 were an output pad of the IC, the activation of the edge detector 312 should result in either an incorrect output signal value, or a missed transition in the output signal value. In this manner the ability of either a simulation or of a circuit tester vector set may be evaluated, as to whether the presence of clock speed dependent circuit failures is detectable or not.

Figure 8:
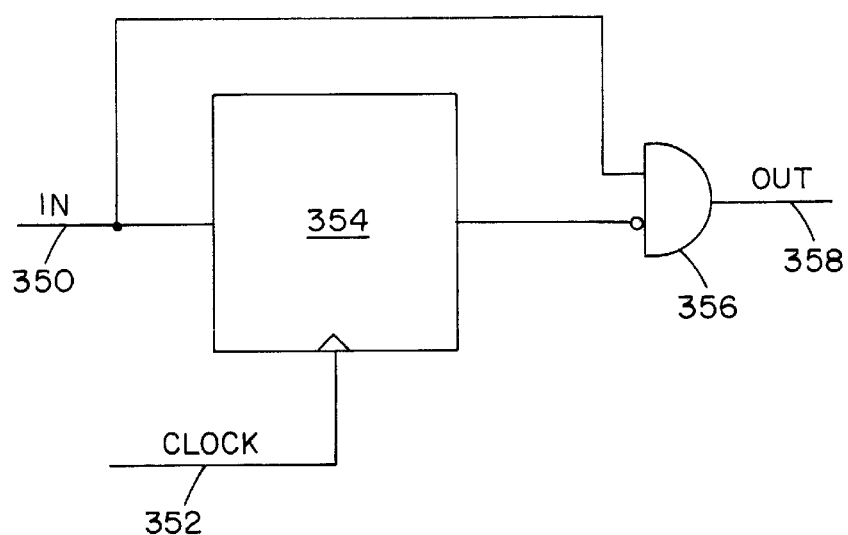
FIG. 8 is a circuit diagram of an edge detector.

The edge detectors used in each of the three embodiments of the invention that have been described may be any one of many well-known edge detectors available. The invention can use either rising edge detectors or falling edge detectors that hold the output signal high or low for a prescribed period of time. In a preferred embodiment of the invention the rising edge detector used is shown in FIG. 8, where the IN signal 350 is the same IN signal that connects to the combinatorial logic under test, the clock line 352 is the same clock line that is used by the combinatorial logic under test, and the output of latch 354 is inverted prior to entering the AND gate 356, to provide a rising edge detector that holds a high on the output 358 for one clock cycle.

The present invention easily verifies whether a test pattern is sensitive to clock speed problems by providing a complementary logic value at the logic element output only when all of the conditions needed for the proper logic element output are present. These necessary conditions are known as the critical path identifiers, and allow the complementary logic value to be imposed on the logic output by means of a conditional inversion such as an exclusive OR gate having one input from an AND gate combining all of the CPI inputs. This emulates a time critical delayed signal, but without having to calculate all of the possible time interactions. In other words, the conditional inverter has taken time out of the equation. It should be noted that the location of the edge detectors 106 and 202 in FIGS. 2 and 6 must be set so that all of the critical path logic elements are contained within the edge detector's range. For example, in FIG. 2 the input to edge detector 106 might beneficially connect to the input clock of latch 14 rather than the output as shown.

A typical implementation of the invention in a circuit verifier would also typically include many more edge detectors than have been shown in the illustrative examples. Typically, an implementation of the invention in a circuit model would include one edge detector at each node of the critical circuit path starting with the clock.

The invention verifies that all of the CPI inputs were meet and that a circuit speed fault can be observed using the test patterns, meaning that all of the propagation circuitry inputs are correct. The invention may be used in test pattern generation, manual pattern verification, and concurrent fault testing or simulation, and may be inserted onto the IC to verify the tester functionality.

While this invention has been particularly shown and described with references to preferred embodiments thereof, it will be understood by those skilled in the art that various changes in form and details may be made therein without departing from the spirit and scope of the invention as defined by the appended claims.

What is claimed is:

1. A method of evaluating test patterns for testing critical circuit paths on an electronic device for timing faults, comprising the steps of:

determining a logical model for at least a portion of a circuit design, the circuit design having a plurality of circuit paths, each individual one of the plurality of circuit paths having a starting point and an ending point, the logical model providing at least a logical value transition at the starting point, the transition providing a uniquely defined logical value at the ending point of each individual one of the plurality of circuit paths;

selecting an individual one of the circuit paths;

determining a trial test pattern disposed to electrically exercise the selected one of the circuit paths;

inserting an inverted logical value at a selected time at a first selected location on the circuit path, said logical value remaining inverted for a predetermined variable time; and determining whether the inverted logical value at the first selected location at the selected period of time results in an incorrect logical value at a second selected location on the circuit path.

2. The method of claim 1, further comprising:

setting a good test pattern signal flag if the incorrect logical value at the second selected location is detected, and setting a bad test pattern signal flag if a correct logical value at the second selected location is detected.

3. The method of claim 1 wherein the predetermined variable time is approximately one clock cycle.

4. The method of claim 1 wherein the inverted logical value at the first selected location results in a missing logical value transition at the second selected location on the circuit path.

5. The method of claim 1 wherein the individual one of the plurality of circuit paths is selected as having suspected operating speed problems.

6. The method of claim 1 wherein the trial test pattern is manually generated.

7. An iterative method of evaluating test patterns for fault coverage in testing speed critical paths on an electronic device for timing faults, comprising the steps of:

determining a logical model for a circuit design, the circuit design having a plurality of circuit paths, each individual one of the plurality of circuit paths having at least a starting point and an ending point, the logical model providing at least a logical transition value at the starting point of each individual one of the plurality of circuit paths; and the logical transition value providing a uniquely defined logical value at the ending point of each individual one of the plurality of circuit paths;

determining which individual ones of the plurality of circuit paths of the circuit design have potential speed critical design issues;

selecting a first individual one of the circuit paths having the design issue;

determining a trial test pattern disposed to electrically exercise the first individual one of the circuit paths;

inserting an inverted logical value during a selected period of time at a first selected location on the first individual one of the circuit paths, the logical value remaining inverted for a predetermined time;

determining whether the inverted logical value at the first selected location at the selected period of time results in an incorrect logical value at a second selected location on the circuit path;

setting a good test pattern signal flag if the incorrect logical value at the second selected location is detected, and setting a bad test pattern signal flag if a correct logical value at the second selected location is detected; and selecting a second individual one of the circuit paths having a speed critical issue and iteratively repeating the method until all of the circuit paths have been evaluated.

8. The method of claim 7 wherein the step of determining the trial test pattern disposed to electrically exercise the first individual one of the circuit paths having the speed critical faults is manually generated.

9. The method of claim 7 wherein the step of setting a bad test pattern signal flag if a correct logical value at the second selected location is detected further includes a step of computer generating a new trial test pattern disposed to electrically exercise the first individual one of the circuit paths having the speed critical faults, and repeating until either a good test pattern signal flag is set, or until a predetermined number of iterations has elapsed.

10. The method of claim 7 wherein the first selected location on the first individual one of the circuit paths having the speed critical fault is at the starting point of the circuit path.

11. The method of claim 7 wherein the second selected location on the circuit path having the speed critical fault is at the ending point of the circuit path.

12. A digital computer programmed to evaluate test patterns for testing speed critical paths on electronic devices, comprising:

generating a computer logical model for a plurality of circuit paths on an electronic design, each one of the plurality having at least a starting point and an ending point:

calculating which individual ones of the plurality of circuit paths have potential operating speed critical design issues; and the logical model calculating at least a logical value transition at the starting point and a resulting uniquely defined logical value at the ending point of at least one of the circuit paths having speed issues;

selecting a trial test pattern disposed to electrically exercise the circuit path having the speed critical fault;

inserting an inverted logical value during a selected period of time at a first selected location on the circuit path, the logical value remaining inverted for a predetermined time period;

simulating whether the inverted logical value at the first selected location at the selected period of time results in an incorrect logical value at a second selected location on the circuit path; and setting a good test pattern signal flag if the incorrect logical value at the second selected location is detected, and setting a bad test pattern signal flag if a correct logical value at the second selected location is detected.

13. The computer of claim 12 wherein the predetermined time period is approximately one clock period.

14. A testing system for verifying test patterns for speed critical paths on electronic devices, comprising:

means for applying a trial test pattern to a computer model of the speed critical paths;

means for inverting a logical value during a selected period of time at a first selected location on the circuit path for a predetermined time period; and means for determining whether the inverted logical value at the first selected location results in an incorrect logical value at the ending point of the circuit path.

15. A method of evaluating test patterns, comprising:

providing a circuit to be tested;

modifying the circuit to provide a logic complement for a critical path output when, and only when, identifying conditions of the critical path occur;

applying the test patterns to the modified circuit; and determining whether the critical path output indicates an error.

16. A computer programmed to evaluate test patterns for testing critical paths on an electronic device, comprising:

a central processing unit connected to a memory and an input/output unit;

software to apply a trial test pattern having a conditionally inverted logical value to a circuit for a selected time period; and software to determine whether the inverted logical value results in an incorrect logical value at a different point of the circuit.

17. The computer of claim 16 wherein the electronic device is a field programable gate array integrated circuit.

* * * * *